(12) United States Patent
Bioglio et al.

(10) Patent No.: US 12,375,105 B2
(45) Date of Patent: Jul. 29, 2025

(54) DEVICE AND METHOD FOR ENCODING OR DECODING MESSAGES BY MEANS OF A POLAR CODE

(71) Applicant: Huawei Technologies Co., Ltd., Shenzhen (CN)

(72) Inventors: Valerio Bioglio, Boulogne Billancourt (FR); Carlo Condo, Munich (DE)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/875,082

(22) Filed: Jul. 27, 2022

(65) Prior Publication Data

US 2022/0376707 A1 Nov. 24, 2022

Related U.S. Application Data

(63) Continuation of application No. PCT/EP2020/051909, filed on Jan. 27, 2020.

(51) Int. Cl.
*H03M 13/13* (2006.01)
*H03M 13/00* (2006.01)
*H03M 13/29* (2006.01)
*H04L 1/00* (2006.01)

(52) U.S. Cl.
CPC ....... *H03M 13/13* (2013.01); *H03M 13/2906* (2013.01); *H03M 13/616* (2013.01); *H03M 13/6575* (2013.01); *H04L 1/0057* (2013.01); *H04L 1/0061* (2013.01); *H04L 1/0071* (2013.01)

(58) Field of Classification Search
CPC ............. H03M 13/13; H03M 13/2906; H03M 13/616; H03M 13/6575; H04L 1/0057; H04L 1/0061; H04L 1/0071
USPC ........................................................ 714/746
See application file for complete search history.

(56) References Cited

U.S. PATENT DOCUMENTS

| | | | |
|---|---|---|---|
| 10,673,468 B2 * | 6/2020 | Ge ........................ | H03M 13/616 |
| 2015/0381208 A1 * | 12/2015 | Li ........................ | H03M 13/616 |
| | | | 714/755 |
| 2017/0214416 A1 * | 7/2017 | Ge ........................ | H03M 13/13 |

(Continued)

FOREIGN PATENT DOCUMENTS

CN 108304658 A 7/2018

OTHER PUBLICATIONS

Gabry et al., Multi-kernel construction of polar codes, published May 2017, IEEE, 2017 IEEE International Conference on Communications Workshops (ICC Workshops), pp. 1-5 (Year: 2017).*

(Continued)

*Primary Examiner* — John J Tabone, Jr.
(74) *Attorney, Agent, or Firm* — Leydig, Voit & Mayer, Ltd.

(57) ABSTRACT

A device is configured for encoding an input sequence comprising message bits into a codeword using a polar code. The device is configured to sequentially encode each of a plurality of blocks of the input sequence by applying a sliding window to the input sequence, wherein each block of the input sequence is encoded based on an XOR operation of the block and a previous block of the input sequence to obtain a codeword block of the codeword, and sequentially output each obtained codeword block of the codeword.

10 Claims, 9 Drawing Sheets

(56) References Cited

U.S. PATENT DOCUMENTS

| | | | | |
|---|---|---|---|---|
| 2018/0026663 | A1* | 1/2018 | Wu | H03M 13/618 |
| | | | | 714/776 |
| 2019/0158128 | A1* | 5/2019 | Ge | H03M 13/616 |
| 2019/0165884 | A1* | 5/2019 | Koike-Akino | H04L 1/0071 |
| 2019/0190545 | A1 | 6/2019 | Gross et al. | |
| 2019/0391870 | A1* | 12/2019 | Varanasi | G11C 29/52 |
| 2020/0259621 | A1* | 8/2020 | Oh | H04L 1/1822 |
| 2022/0376707 | A1* | 11/2022 | Bioglio | H03M 13/6575 |

OTHER PUBLICATIONS

Vangala et al., "A New Multiple Folded Successive Cancellation Decoder for Polar Codes," 2014 IEEE Information Theory Workshop (ITW 2014, Nov. 2, 2014,pp. 381-385, XP032694569, ISSN: 1662-9019, DOI: 10.1109/ITW.2014.6970858, retrieved on Dec. 1, 2014, pp. 381-385 (2014).

Arikan et al., "Channel Polarization: A Method for Constructing Capacity-Achieving Codes for Symmetric Binary-Input Memoryless Channels," IEEE Transactions on Information Theory, vol. 55, No. 7, pp. 3051-3073, Institute of Electrical and Electronics Engineers, New York, New York (Jul. 2009).

Mediatek Inc., "Resolving Polar Code Memory Complexity Issue," 3GPP TSG RAN WG1 Meeting #86bis, Lisbon, Portugal, R1-1609338, XP051149381, retrieved from theInternet on Sep. 10, 2016 at URL:http://www.3gpp.org/ftp/ Meetingses 3GPP_SYNC/RAN1/Docs/, total 5 pages, 3rd Generation Partnership Project, Valbonne, France (Oct. 10-14, 2016).

Ha et al., "Rate-Compatible Puncturing of Low-Density Parity-Check Codes," IEEE Transactions on Information Theory, vol. 50, No. 11, pp. 2824-2836 (Nov. 2004).

Gabry et al., "Multi-Kernel Construction of Polar Codes," 2017 IEEE International Conference on Communications Workshops (ICC Workshops), Paris, total 5 pages, ICC2017: WT09-Channel Coding for 5G and Future Networks (2017).

Tal et al., "List Decoding of Polar Codes," IEEE Transactions on Information Theory, vol. 61, No. 5, total 11 pages, (May 2015).

Afisiadis et al., "A Low-Complexity Improved Successive Cancellation Decoder for Polar Codes," in Asilomar Conf. on Signals, Syst., and Comput., pp. 2116-2120 (Nov. 2014).

Vangala et al., "A Comparative Study of Polar Code Constructions for the AWGN Channel," in arXiv preprint arXiv:1501.02473, pp. 1-9 (2015).

Vangala et al., "A New Multiple Folded Successive Cancellation Decoder for Polar Codes," Total 5 pages (Nov. 2-5, 2014).

Mediatek et al., "Resolving Polar Code Memory Complexity Issue," 3GPP TSG RAN WG1 Meeting #86bis, Lisbon, Portugal, R1-1610420, Total 6 pages (Oct. 10-14, 2016).

* cited by examiner

- Message:

$m = [1\ 1\ 1\ 0\ 0\ 0\ 0\ 1]$

- Sub-messages:

$m_0 = [0\ 0\ 0\ 1], m_1 = [1], m_2 = [1], m_3 = [1\ 0]$

- Sub-information sets:

$I_1 = \{4\}, I_2 = \{4\}, I_3 = \{3,4\}, I_4 = \{1,2,3,4\}$

- Sub-input vectors:

$u_0 = [0\ 0\ 0\ 1], u_1 = [0\ 0\ 0\ 1], u_2 = [0\ 0\ 0\ 1], u_3 = [0\ 0\ 1\ 0]$

- Sub-codewords:

$u'_0 = [0\ 0\ 0\ 1], u'_1 = [0\ 0\ 0\ 0], u'_2 = [0\ 0\ 0\ 0], u'_3 = [0\ 0\ 1\ 1]$

- Transmitted codewords:

- Transmitted codeword:

$x' = $ | 1 | 1 | 1 | 1 | 0 | 0 | 0 | 0 | 0 | 0 | 0 | 0 | 0 | 1 | 0 | 1 |

- Received channel LLRs: (highlighted blocks represent sign error)

$y = $ | -1.3 | -0.2 | -0.5 | 0.2 | 1.1 | 0.7 | 0.5 | 1.1 | 0.8 | -0.5 | 1.0 | 0.4 | 1.0 | -0.8 | 1.4 | -0.6 |

- Information set:

$I = \{4, 8, 11, 12, 13, 14, 15, 16\}$

- LLR buffer initialization:

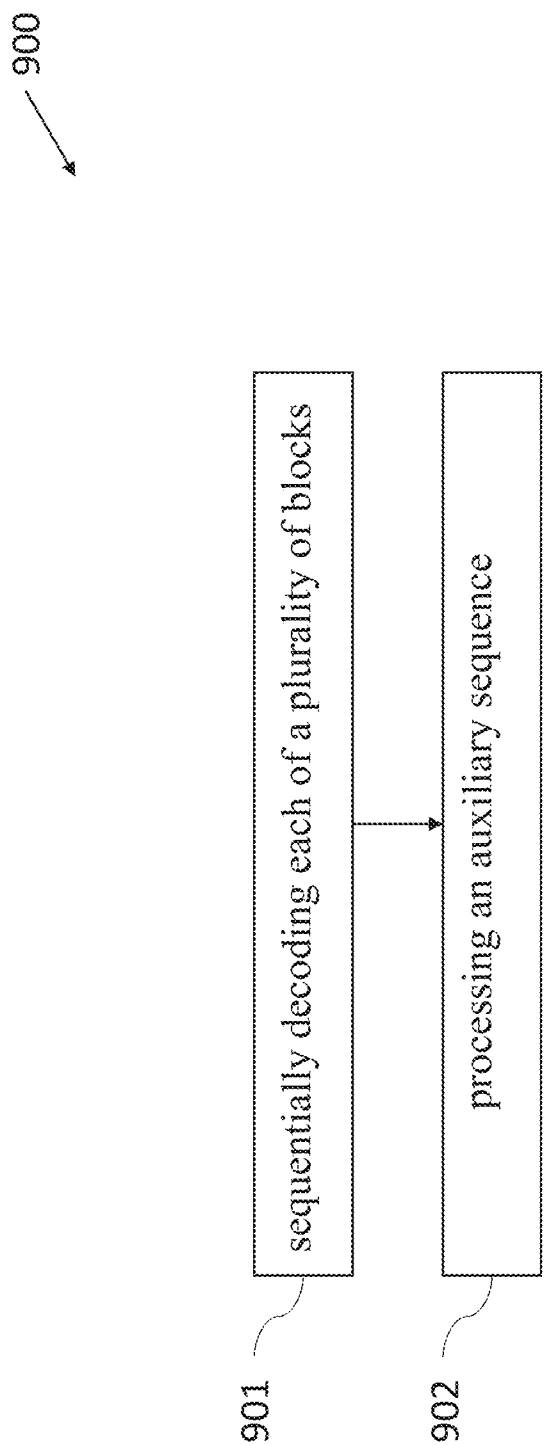

DEVICE AND METHOD FOR ENCODING OR DECODING MESSAGES BY MEANS OF A POLAR CODE

CROSS-REFERENCE TO RELATED APPLICATIONS

This application is a continuation of International Application No. PCT/EP2020/051909, filed on Jan. 27, 2020, the disclosure of which is hereby incorporated by reference in its entirety.

FIELD

The present disclosure relates to encoding and decoding data. In particular, it relates to encoding and decoding data using a polar code. Thereby, embodiments of the present disclosure provide devices and methods for encoding and decoding data by applying a sliding window.

BACKGROUND

Channel codes are essential in all digital communications systems. A system for forward error correction (FEC) coding, also called generally a coding scheme, consists of an encoder at the transmitter side and a decoder at the receiver side. The encoder adds redundancy to the data to be transmitted, i.e. additional redundant data, and the decoder exploits this redundancy to correct transmission errors, such that the receiver can obtain the transmitted data free of errors despite a noisy communication channel between encoder and decoder.

In particular, polar codes are linear block codes that rely on the polarization effect (see, e.g., E. Arikan, "*Channel polarization: A method for constructing capacity achieving codes for symmetric binary-input memoryless channels*", IEEE Transactions on Information Theory, vol. 55, no. 7, pp. 3051-3073, July 2009), which allows to sort bit positions of so-called bit-channels in order of reliability. As the code length goes toward infinity, the polarization phenomenon influences the reliability of bit-channels, which are either completely noisy or completely noiseless. Even more, the fraction of noiseless bit-channels equals the channel capacity.

The reliability of the channels can be determined according to the Bhattacharyya parameter:

$$Z(W) = \sum_{y \in Y} \sqrt{W(y|0)W(y|1)}$$

where W is a binary memoryless symmetric channel, and W(y|0), W(y|1) are transition probabilities, Y is the output alphabet and Z is the Bhattacharyya parameter. The lower the Bhattacharyya parameter, the more reliable the channel. Other methods may be used to estimate bit-channel reliabilities. For example, a density evolution method (DE) may be used, and for additive white Gaussian noise (AWGN) the channels reliabilities may be determined according to a Gaussian approximation (GA). Other categories of noisy channels may be modelled such as a binary symmetric channel (BSC) or a binary erasure channel (BEC), for example, using Monte-Carlo statistical methods.

For finite practical code lengths, the polarization of bit-channels is incomplete. Therefore, there are bit-channels that are partially noisy. The polar encoding process consists in the classification of the bit-channels into two groups: the most reliable bit-channels that will carry the information bits and are indexed by the information set, and the less reliable bit-channels that are fixed to a predefined value (usually 0) and are indexed by the frozen set. In case of finite code lengths, the bit-channels with the highest reliability are selected to form the information set, while the remaining bit-channels are frozen.

Polar codes are based on the kernel matrix:

$$T_2 = \begin{bmatrix} 1 & 0 \\ 1 & 1 \end{bmatrix}.$$

Encoding of such a polar code of length N=2$^n$ and information length K is explained in the following. The frozen set F of size N−K is chosen, as described above. The bits $u_i$ of the input vector u are set to 0 for $i \in F$ and to the information bits otherwise. The codeword x is computed as x=uT with the transformation matrix T=$T_2^{\otimes n}$, $\otimes n$ denoting the n-fold Kronecker product.

As a generalization, different kernels of different sizes can be introduced in the code design, obtaining a multi-kernel polar code (see, e.g., V. Bioglio et al., "*Multi-kernel construction of polar codes*", 2017 IEEE International Conference on Communications Workshops (ICC Workshops), Paris, 2017, pp. 761-765.). As a result, the transformation matrix takes the form T=$T_a \otimes T_b \otimes \ldots \otimes T_g$, and the frozen set has to be calculated accordingly.

Polar code decoding can be based on a Successive Cancellation (SC) decoding algorithm (see, e.g., the aforementioned work of Arikan), which is inherently sequential. It can be viewed as a binary tree search, where bits are estimated at leaf nodes, and the tree is traversed depth-first, with priority given to the left branch. In SC decoding, the decoder starts with a decision for bit $u_1$ and feeds this decision back into the decoding process. Then, it makes a decision of bit $u_2$ and feeds this decision back into the decoding process. It proceeds in this fashion until it obtains the design for the last bit $u_N$.

SC list decoding (SCL) is an enhanced version of SC, wherein the decision is postponed to the end of the decoding process, and is usually performed with the help of a cyclic redundancy check (CRC) (see, e.g., O. Afisiadis et al., "*A low-complexity improved successive cancellation decoder for polar codes*", in Asilomar Conf. on Signals, Syst., and Comput., November 2014, pp. 2116-2120).

When too many information bits need to be transmitted, they are usually divided into blocks and transmitted separately on an independent codeword of length M. However, independent transmissions increase the block error rate of the system, since information is correctly recovered, only if all the S codewords are decoded correctly. Even a single error in one of the transmission results in an overall decoding failure.

Moreover, many polar-code-based encoding and decoding devices and methods are too complex. Thus, the inventors have recognized that there is generally a need for improved devices for coding data using polar codes.

SUMMARY

In view of the above-mentioned disadvantages, the present disclosure provides improved devices and methods for encoding and decoding based on polar code. A polar-code based encoding device and method is provided, and a polar-code based decoding device and method is provided, these devices and methods can operate with reduced complexity.

According to a first aspect, a device for encoding an input sequence comprising message bits into a codeword using a polar code is provided. The device is configured to sequentially encode each of a plurality of blocks of the input sequence, by applying a sliding window to the input sequence, wherein each block of the input sequence is encoded based on an XOR (exclusive or) operation of the block and a previous block of the input sequence, to obtain a codeword block of the codeword, and sequentially output each obtained codeword block of the codeword.

The device of the first aspect, which may be implemented in an encoder, is designed for performing polar code based encoding with a sliding window, which reduces the encoding complexity. For instance, the device permits calculating the codewords as linear combinations of common codewords. This may reduce the cost of additional hardware to be installed in the device, since it can rely on standard polar code hardware. Moreover, the use of the device permits reducing the encoding latency, since message bits can be processed on-the-fly. Finally, the device has the same Block Error Rate (BLER) performance as a conventional device for encoding without sliding window based on a polar code.

In an embodiment of the device according to the first aspect, the previous block is a predetermined block or the previous block is equal to the last block of the input sequence.

This provides a simple but efficient implementation of the coding scheme.

In an embodiment of the device according to the first aspect, the device is further configured apply a transformation matrix, $T_{M/2}$, of a polar code of length M/2, wherein $T_{M/2}=T_2^{\otimes n}$, with $n=\log_2(M)$ and M being a size of the sliding window to the block and the previous block of the input sequence to obtain the codeword block of the codeword.

This provides an exemplary implementation of a sliding window for the polar code encoding.

In an embodiment of the device according to the first aspect, the device is further configured to calculate a first block on the basis of the predetermined block and the transformation matrix.

In an embodiment of the device according to the first aspect, the device is configured to determine a reliability of bit positions of each block of the input sequence $u_i$, determine an information set $I_i$ of size $K_i$ for each block of the input sequence $u_i$, wherein $K_i$ corresponds to a size of a corresponding block of the message bits $m_i$ and wherein the set $I_i$ corresponds to the $K_i$ bit positions of each block of the input sequence $u_i$ having the highest reliability and generate each block of the input sequence $u_i$ by placing the message bits $m_i$ in the positions defined by $I_i$.

According to a second aspect, a device for decoding a sequence of bits into an output sequence using a polar code is provided, wherein the sequence of bits represents a codeword after a transmission over a communication channel. The device is configured to sequentially decode each of a plurality of blocks of the sequence of bits by applying a sliding window, in order to obtain an auxiliary sequence, process the auxiliary sequence to obtain the output sequence, wherein each block of the output sequence is processed based on an XOR operation of a block of the auxiliary sequence and a previous block of the auxiliary sequence.

The device of the second aspect, which may be implemented in a decoder, is designed for performing polar code based decoding with a sliding window, which reduces the decoding complexity. This permits reducing the cost of additional hardware to be installed in the device, since the device can rely on standard polar code hardware.

In an embodiment of the device according to the second aspect, the device is further configured to obtain message bits from the output sequence.

According to a third aspect, a method for encoding an input sequence comprising message bits into a codeword using a polar code is provided. The method comprises sequentially encoding each of a plurality of blocks of the input sequence, by applying a sliding window to the input sequence, encoding each block of the input sequence based on an XOR operation of the block and a previous block of the input sequence, to obtain a codeword block of the codeword, and sequentially outputting each obtained codeword block of the codeword.

According to a fourth aspect, a method for decoding a sequence of bits into an output sequence using a polar code is provided, wherein the sequence of bits represents a codeword after a transmission over a communication channel. The method comprises sequentially decoding each of a plurality of blocks of the sequence of bits by applying a sliding window, in order to obtain an auxiliary sequence, processing the auxiliary sequence to obtain the output sequence, wherein each block of the output sequence is processed based on an XOR operation of a block of the auxiliary sequence and a previous block of the auxiliary sequence.

The methods of the third aspect and the fourth aspect achieve the same advantages as, respectively, the devices of the first aspect and the second aspect. The method of the third aspect may have implementation forms according to the implementation forms of the device of the first aspect. The method of the fourth aspect may have implementation forms according to the implementation forms of the device of the second aspect.

According to a fifth aspect, a computer program is provided, the computer program comprising a program code for performing the method according to the third or the fourth aspect, when executed on a computer.

In an embodiment, the computer program can be provided on a non-transitory computer-readable storage or recording medium. The computer program, when executed by a processor, causes the processor to perform the method according to the third or the fourth aspect.

In an embodiment, the computer program is implemented in programmable hardware. The programmable hardware may comprise components such as application-specific integrated circuits (ASICs), field-programmable arrays (FPGAs), digital signal processors (DSPs), or general-purpose processors.

It has to be noted that all devices, elements, units and means described in the present disclosure could be implemented in the software or hardware elements or any kind of combination thereof. All steps which are performed by the various entities described in the present application as well as the functionalities described to be performed by the various entities are intended to mean that the respective entity is adapted to or configured to perform the respective steps and functionalities. Even if, in the following description of exemplary embodiments, a specific functionality or step to be performed by external entities is not reflected in the description of a specific detailed element of that entity which performs that specific step or functionality, it should be clear for a skilled person that these methods and functionalities can be implemented in respective software or hardware elements, or any kind of combination thereof.

BRIEF DESCRIPTION OF DRAWINGS

The above described aspects and implementation forms of the present disclosure will be explained in the following description of exemplary embodiments in relation to the enclosed drawings, in which:

FIG. 2 shows an exemplary message encoded by a device according to an embodiment;

FIG. 3 shows a schematic representation of matrices used to encode an input sequence according to an embodiment;

FIG. 7 shows a codeword encoded by a device according to an embodiment;

FIG. 9 shows a method for decoding a sequence comprising a message according to an embodiment.

DETAILED DESCRIPTION

Figure 1:
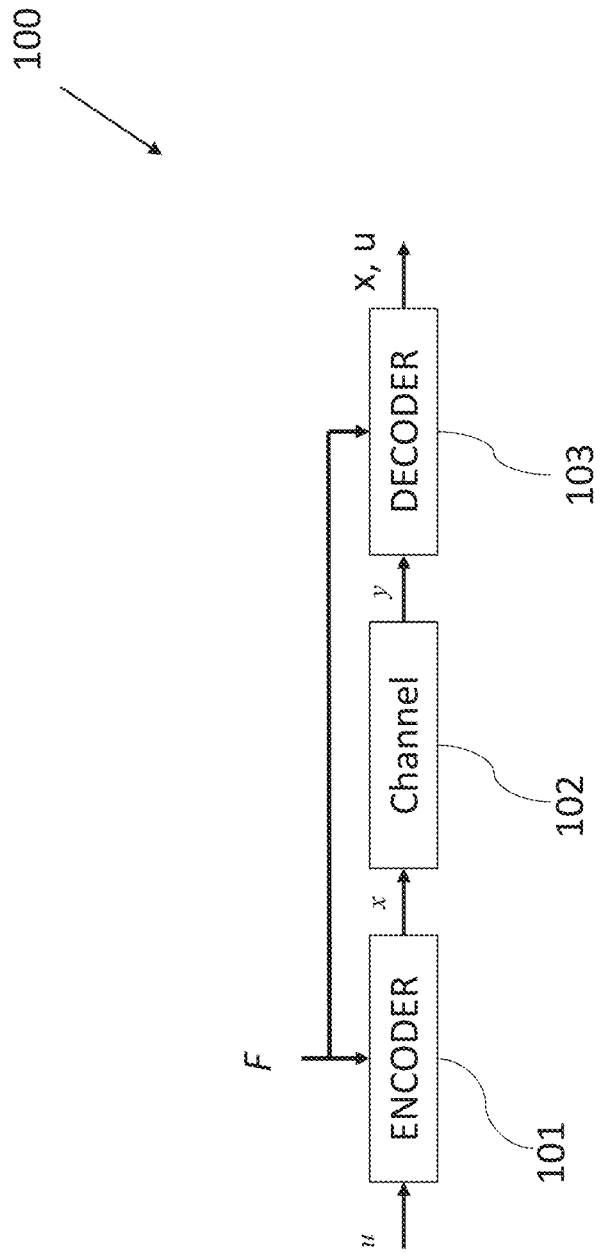
FIG. 1 shows a communication system comprising a device for encoding an input sequence according to an embodiment.

FIG. 1 shows a data communication system 100 comprising a device 101 ("encoder") according to an embodiment of the present disclosure. The device 101 is configured to encode an input sequence u, which comprises the bits of a message m, into a codeword x using a polar code.

The device 101 is generally configured to obtain the input sequence u to be transmitted (the "input sequence" may also be termed "information word" or "input vector"), and to produce the codeword x, which may contain redundancy. This codeword x may, then, be transmitted over a noisy communication channel 102 to a device 103 ("decoder") for decoding, e.g., according to another embodiment of the present disclosure. This transmission typically introduces errors. The noisy signal may be received by the decoder 103 as a sequence of bits y (the "sequence of bits" may also termed "output vector"). The decoder 103 may then use the received bit values to calculate estimates of the transmitted codeword x and the transmitted message m. The set of possible codewords is called the code, or the channel code. In this embodiment, a polar code is used at the encoder 101 to encode the input sequence u. Both the encoder 101 and decoder 103 may know the polar code and, thus, may be aware of positions of the frozen bits F or information set I, respectively. The information set I (sometimes also called "reliability sequence") may be used by the decoder 103 in both determining the input sequence u (e.g. during successive decoding) and in extracting the message bits m from the input sequence u.

The encoder 101, according to the embodiment of the present disclosure, is configured to sequentially encode each of a plurality of blocks $u_i$ of the input sequence u, by applying a sliding window to the input sequence u. Each block $u_i$ of the input sequence u is encoded based on an XOR operation of the block $u_i$ and a previous block $u_{i-1}$ of the input sequence u, to obtain a codeword block $x'_i$ of the codeword x'. Further, the encoder 101 is configured to sequentially output each obtained codeword block $x'_i$ of the codeword x'.

Moreover, the decoder 103 is configured to decode the sequence of bits y into an output sequence u using the polar code. The sequence of bits y represents the codeword x after transmission over the (noisy) communication channel 102. The decoder 103, according to an embodiment of the invention, is configured to sequentially decode each of a plurality of blocks of the sequence of bits y by applying a sliding window, in order to obtain an auxiliary sequence u'. Further, the decoder 103 is configured to process the auxiliary sequence u' to obtain the output sequence u, wherein each block of the output sequence u is processed based on an XOR operation of a block of the auxiliary sequence and a previous block of the auxiliary sequence $u_{i-1}'$. Furthermore, the device 103 can be configured to obtain message bits m from the output sequence u.

For the sake of the completeness, in the following, a summary of the theory behind the sliding window polar coding, as applied in embodiments of the present disclosure, is given.

An exemplary sliding window polar code of length N and dimension K, which it is decodable through a sliding window of size M, may be designed as follows. Given S=N/M, its transformation matrix can be defined as $T=W_{2S} \otimes T_{M/2}$, where $T_{M/2}=T_2^{\otimes m}$, with $m=\log_2(M)$, is the transformation matrix of a classical polar code of length M/2, while $W_{2S}$ is a full binary lower triangular matrix of size 2S. This matrix is given by a square matrix of size 2S×2S having ones on and below the diagonal, and zeros above the diagonal. The resulting transformation matrix T can be described as a multi-kernel polar code (see the aforementioned work of Bioglio et al.). This also permits to calculate the frozen set F accordingly.

Figure 3:
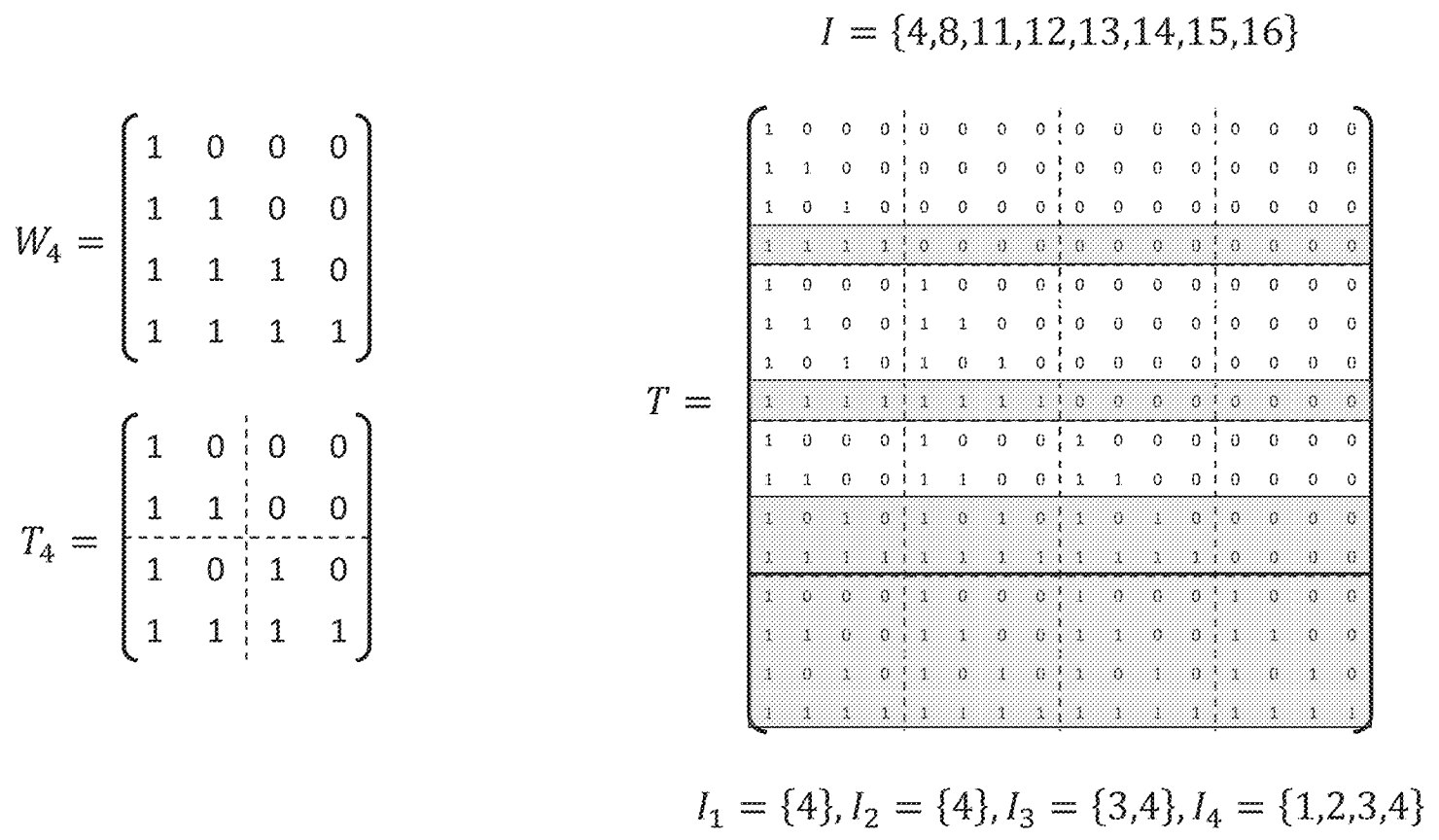

In the following, as also exemplarily illustrated in FIG. 2, an example of the proposed framework for a sliding window polar code of length N=16 and dimension K=8 with window size M=8 is given. It is assumed that a message m=00011110 is to be encoded. This message m can be encoded by means of the matrix $T=W_4 \otimes T_4$, wherein numerical representation of the matrices $W_4$, $T_4$, and T are shown as example in FIG. 3. In order to perform the encoding of the message m, the information set I or, equivalently, the frozen set of bits F is needed. For the generation matrix T, the information set I is shown in FIG. 3 and may be given by I={4,8,11,12,13,14,15,16}. Moreover, as illustrated in FIG. 3, from the information set I, sub-information sets $I_1=\{4\}$, $I_2=\{4\}$, $I_3=\{3,4\}$, $I_4=\{1,2,3,4\}$ may be obtained as well as the four corresponding sub-input vectors $u_1$ to $u_4$ populated accordingly (see FIG. 2).

Depending on the sub-information set $I_1, \ldots I_4$, the bits of the message m may be divided in four blocks $m_0=0001$, $m_1=1$, $m_2=1$ and $m_3=10$ (see FIG. 2). The input vector blocks $u_i$ are, then, given by $u_0=0001$, $u_1=0001$, $u_2=0001$ and $u_3=0010$ (see FIG. 2). The sliding window encoder 101 may first calculate $x'_1=u_0 \cdot T_4=1111$ and transmits it, then other codeword block may be calculated sequentially obtaining $x'_2=(u_1 \otimes u_0) \cdot T_4=0000$, $x'_3=(u_2 \otimes u_0) \cdot T_4=0000$ and $x'_4=(u_3 \otimes u_0) \cdot T_4=0101$ (see FIG. 2).

Figure 4:
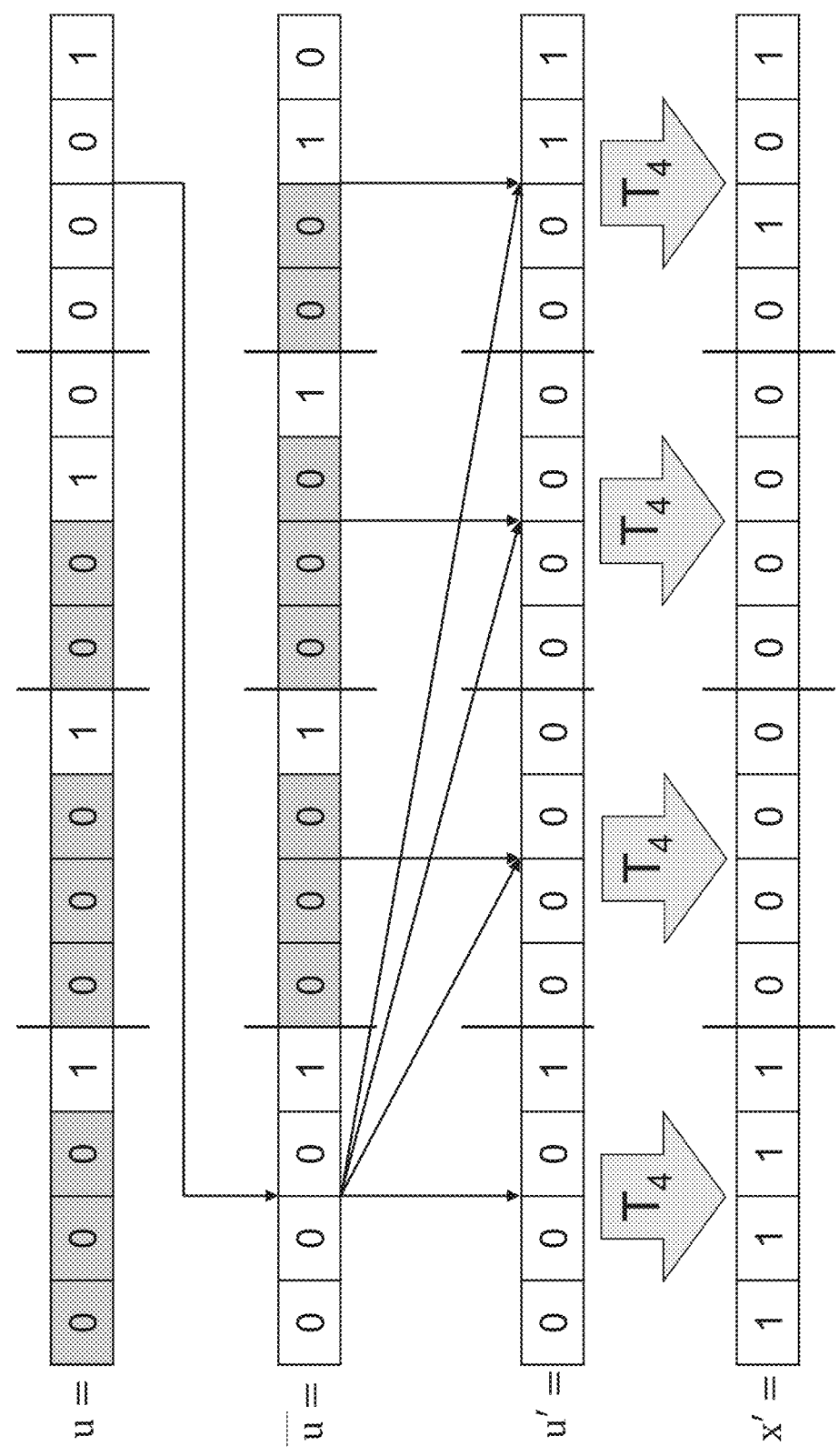
FIG. 4 shows a schematic representation of an input sequence encoded by a device according to an embodiment.

At the decoder side, received blocks may be processed in couples to recover the auxiliary input vector u'. The first input vector is retrieved as $u_1=u'_1=0001$. After the second auxiliary input vector $u'_2=0000$ has been decoded, the second input vector block can be calculated as $u_2=u'_1 \oplus u'_2=0001$ and the message block $m_1=1$ can be extracted. The other message blocks may be calculated accordingly with the subsequent auxiliary input vectors. In FIG. 4, the exemplary input vector u, its shifted vector $\bar{u}$, the vector u' obtained on the basis of $\bar{u}$, and the corresponding codeword x' are shown. The transmitted codeword x' is received after transmission of the communication channel as vector y, as shown in FIG. 1.

Figure 5:
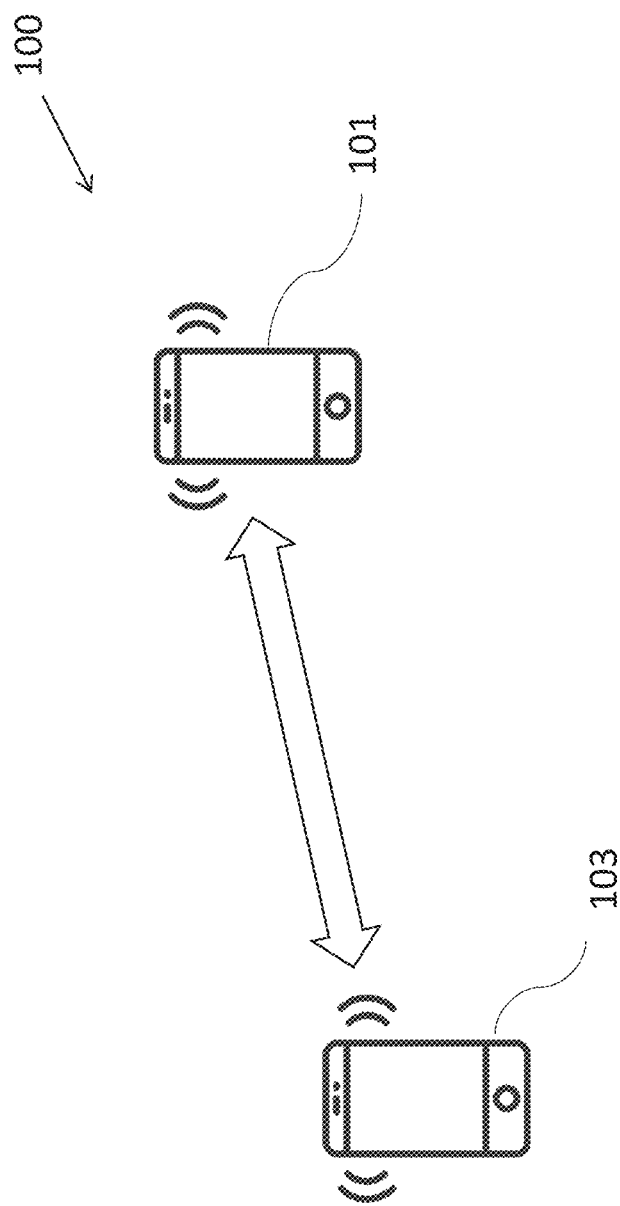
FIG. 5 shows a communication system comprising a device for encoding an input sequence according to an embodiment.

The proposed polar code design and decoding procedure improves BLER performance in the Device-to-Device (D2D) scenario (see FIG. 5) without increasing the decoding computational complexity, and in some cases permitting to reach the performance of the full length polar code.

In the following, some methods for determining the information set I are described.

Under AWGN channel, the DE/GA method (see, e.g., H. Vangala, E. Viterbo, and Y. Hong, "*A comparative study of polar code constructions for the AWGN channel*", in arXiv preprint arXiv:1501.02473, 2015) can be used to evaluate bit-channels polarization of kernel $W_{2s}$ tracking the LLR mean as:

$$\mu_i = \begin{cases} \phi^{-1}(1-(1-\phi(\mu))\cdot(1-\phi(i\mu))), & i < 2S \\ 2S\mu, & i = 2S \end{cases}$$

where μ is the input LLR mean and function φ can be calculated as described in J. Ha, J. Kim, and S. W. McLaughlin, "*Rate-compatible puncturing of low-density parity-check codes*", IEEE Transactions on Information Theory, vol. 50, no. 11, pp. 2824-2836, 2004. Using the above metrics, the reliability of each bit of the input vector u can be calculated. The K bits having the highest reliability may form the information set I, while the indices of the remaining N–K bit-channels may form the frozen set F of the code. The K message bits may then be inserted in the input vector u according to the information I set previously calculated, namely storing their values in the indices listed in I, while the remaining bits of u are set to zero. Codeword x' is then calculated as x'=u·T and transmitted through the channel 102 (see FIG. 7).

The N channel LLRs may be stored in the vector y (see FIG. 7). Sliding window decoder 103 may perform 2S polar decoding of (M/2, $K_t$) polar codes. Upper LLRs $L_0$ may be initialized to zero (see FIG. 7). At step t, a sub-information set $I_t$ may be calculated from the information set I as the set of entries of I comprised between $$(t-1)\cdot\frac{M}{2}+1$$

and t·M/2 reduced by (t−1)·M/2. This sub-information set may be used as the information set of a polar code having transformation matrix $T_{M/2}$. The M/2 LLRs for this decoder 103 may be calculated as follows on the basis of y: the vector $$L_1 = \left[ y\left((t-1)\cdot\frac{M}{2}+1\right), \dots, y\left(t\cdot\frac{M}{2}\right) \right]$$

is extracted from y, while a second vector $L_2$ of length M/2 is calculated as:

$$L_2(i) = \begin{cases} y\left(t\cdot\frac{M}{2}\right)+i, & t < 2S \\ \infty, & t = 2S \end{cases}$$

The LLRs to be given to the current decoder are calculated on the basis of these two vectors as $=(L_0+L_1) \boxplus L_2$, where $$A \boxplus B \triangleq 2\tanh^{-1}\left(\tanh\frac{A}{2}\cdot\tanh\frac{B}{2}\right) \cong \text{sign}(A)\cdot\text{sign}(B)\cdot\min(A, B).$$

Next, the (M/2, $K_t$) polar code defined by $I_t$ may be decoded via SC using L as channel LLRs. Decoding can be performed with any other polar decoder (device 103), e.g. SCL. The resulting input vector $u_t$ can then used to calculate the partial sums used in the SC decoding as $x_t=u_t\cdot T_{M/2}$; these partial sums are then used to update the upper LLRs $L_0$ as $L_0=(L_0+L_1)\cdot(1-2x_t)$. When t=2S, decoding is concluded, and input vector u is calculated appending all the sub input vectors as u=[$u_1$ $u_2$ ... $u_{2S}$].

In the following, a mathematical demonstration of the robustness of the encoding performed by the device 101 and the decoding performed by the device 103, according to embodiments of the present disclosure, is given.

As first, the device 101 may be configured to encode portions of the input vector u independently using a classical polar code. Moreover, the sliding window encoder mechanism may be implemented by the device 101 to perform on-the-fly encoding of incoming bits of message m.

The device 101 may divide the input vector u into 2S blocks of length M/2 as u=[$u_1$ $u_2$ ... $u_{2S}$] and polar encode each block independently, i.e. by matrix multiplication with channel transformation matrix of size M/2 as $c_i=u_i\cdot T_{M/2}$. These intermediary polar codewords $c_i$ can be used to create a sliding window polar codeword x', having a peculiar input vector u', by transmitting first the last one and performing a XOR operation with all the subsequent polar codewords before transmission. As a consequence, the final transmitted codeword x' is obtained as x'=[$c_{2S}|c_1 \oplus c_{2S}|c_2 \oplus c_{2S}|$ ... $|c_{2S-1} \oplus c_{2S}$].

The rationale to obtain the described framework can be found in the structure of the channel transformation matrix of a sliding window polar code. The codeword may be created on-the-fly without waiting to collect all the bits of the message m. Starting from the original input vector u=[$u_1$ $u_2$ ... $u_{2S}$], this result can be obtained creating the auxiliary input vector u'=[$u'_1$ $u'_2$ ... $u'_{2S}$] imposing $u'_i=u_{i-1} \oplus u_i$ with $u_0=0$. This auxiliary input vector u' may then have the structure u'=[$u_1|u_1 \oplus u_2|u_2 \oplus u_3|$ ... $|u_{2S-1} \oplus u_{2S}$]. Given the nested property of frozen sets, it is known that $I_{i-1} \supseteq I_i$, where $I_i$ is the information set of input vector block $u_i$, so that u and u' share the same frozen set and u' is then well defined. This intermediary vector is in fact the input vector of codeword x' calculated with the proposed framework, x'=u'·T, since u'·T=[$u_{2S}\cdot T_{M/2}|(u_1 \oplus u_{2S})\cdot T_{M/2}|u_2 \oplus u_{2S})\cdot T_{M/2}|$ ... $|(u_{2S-1} \oplus u_{2S})\cdot T_{M/2}$]. As a consequence, the result of sliding window decoding of transmitted codeword x' will be the intermediary input vector u'. However, input vector u is needed to extract message bits, hence a further post processing step is needed at the receiver to retrieve message bits.

At the side of the decoder 103, channel outcomes y corresponding to codeword x' can be decoded by applying the sliding window. As discussed previously, the result of the decoding process is the auxiliary input vector u'. This vector has to be post-processed to retrieve the original input vector u. This process consists of performing a XOR operation of each input vector block with the previously decoded one such that $u_i=u'_{i-1} \oplus u'_i$ with $u'_0=0$. As a consequence, original input vector can be calculated as $u=[u'_1|u'_1 \oplus u'_2|u'_2 \oplus u'_3| \ldots |u'_{2S-1} \oplus u'_{2S}]$.

Therefore, the proposed framework permits to create codes based on polarization that have on-the-fly encoding and decoding. The last input vector block $u_{2S}$ may be moved to the beginning of the message m. It can be supposed that the K bits of message m are going to be transmitted through a sliding window polar code of length N and dimension K with window size M and information set I. For each block $u_i$ forming the input vector u it is in this case possible to extract a sub-information set $I_i$ of size $K_i$. The K message bits stored in vector m are then divided into 2S blocks as $m=[m_0\ m_1\ m_2\ \ldots\ m_{2S-1}]$ of size $K_0, K_1, K_2, \ldots, K_{2S-1}$ respectively, where $|m_0|=K_{2S}$ and $I_0=I_{2S}$. Each block $x'_i$ of encoded vector x' is then calculated as $x'_i=(u_{i-1} \oplus u_0) \cdot T_{M/2}$ for $i=1, \ldots, 2S$, with the exception of first block that is calculated as $x'_1=u_0 \cdot T_{M/2}$. Each block of codeword x' is then calculated using only two sub-input vectors, namely the very first and the current one.

At the decoder 103 side, the sliding window decoding may output blocks of auxiliary input vector u' sequentially. On-the fly decoding may calculate original input vector blocks as $u_i=u'_{i-1} \oplus u'_i$ and extract message bits $m_i$. Last input vector block $u_{2S}$ is used to calculate first message block $m_0$.

Figure 6:
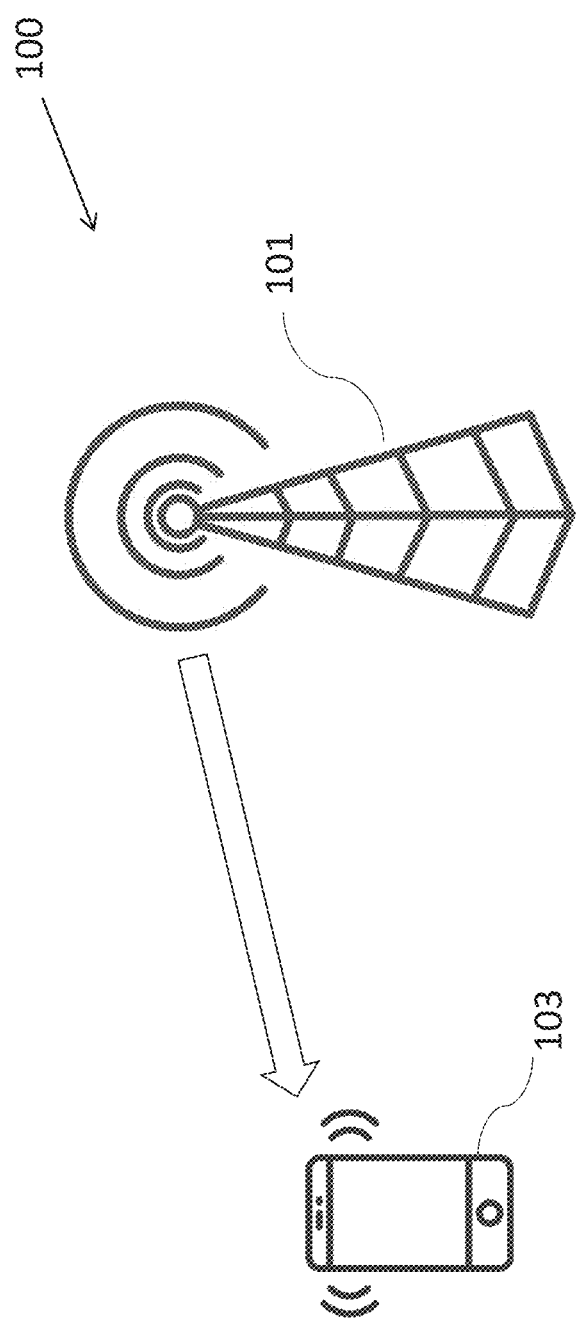
FIG. 6 shows a communication system comprising a device for encoding an input sequence according to an embodiment.

FIG. 6 shows a communication system 100 comprising the device 101 for encoding the input sequence u according to an embodiment.

In particular, FIG. 6 shows the wireless communication system 100 including a base station 101 and user equipment (UE) 103 where the UE 103 may be a portable device such as a smart phone or tablet. The base station 101 includes a transmitter and the UE 103 a receiver, whereby the base station 101 is able to transmit data to the UE 103, for example, in a downlink or uplink connection 102 made according to a telecommunications protocol. Embodiments of the present disclosure may be applied in various communications systems. For example, it could be applied to any of a Global System for Mobile Communications (GSM), code division multiple access (CDMA), wideband code division multiple access (WCDMA), general packet radio service (GPRS), long term evolution (LTE), LTE frequency division duplex (FDD), LTE Time Division Duplex (TDD), a universal mobile telecommunications system (UMTS), enhanced mobile broadband (eMBB), ultra-reliable low-latency communications (URLLC) and massive machine-type communications (mMTC), or any 5th generation (5G) wireless communication system.

Figure 8:
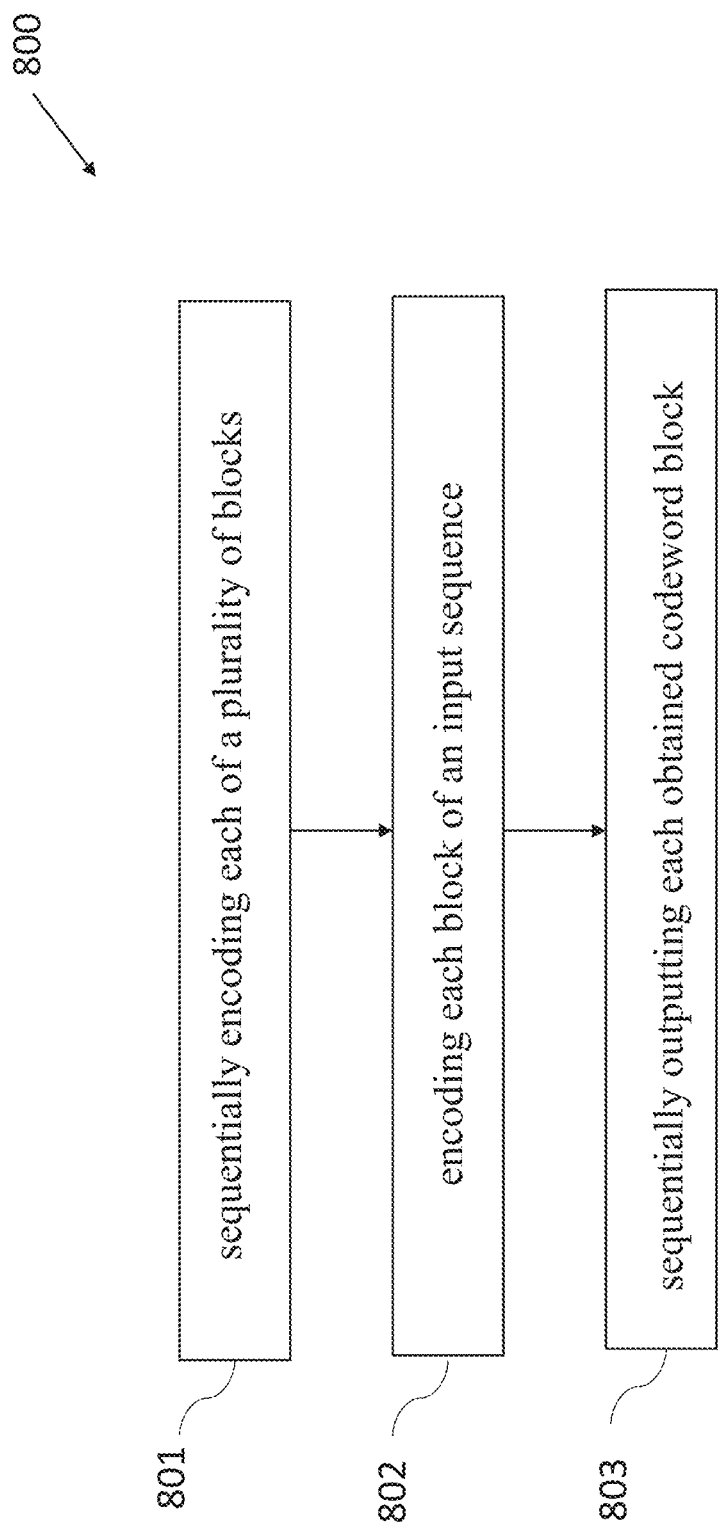
FIG. 8 shows a method for encoding an input sequence comprising a message according to an embodiment.

FIG. 8 shows a method 800 for encoding an input sequence comprising message bits into a codeword using a polar code according to an embodiment.

The method 800 comprises the steps of:
sequentially encoding 801 each of a plurality of blocks of the input sequence, by applying a sliding window to the input sequence,
encoding 802 each block of the input sequence based on an XOR operation of the block and a previous block of the input sequence, to obtain a codeword block of the codeword; and
sequentially outputting 803 each obtained codeword block of the codeword.

FIG. 9 shows a method 900 for decoding a sequence of bits into an output sequence using a polar code, wherein the sequence of bits represents a codeword after a transmission over a communication channel 102 according to an embodiment.

The method 900 comprises: sequentially
decoding 901 each of a plurality of blocks of the sequence of bits by applying a sliding window, in order to obtain an auxiliary sequence,
processing 902 the auxiliary sequence to obtain the output sequence, wherein each block of the output sequence is processed based on an XOR operation of a block of the auxiliary sequence and a previous block of the auxiliary sequence.

In the claims as well as in the description, the word "comprising" does not exclude other elements or steps and the indefinite article "a" or "an" does not exclude a plurality. A single element or other unit may fulfill the functions of several entities or items recited in the claims. The mere fact that certain measures are recited in the mutual different dependent claims does not indicate that a combination of these measures cannot be used in an advantageous implementation.

What is claimed is:

1. A device for encoding an input sequence comprising message bits into a codeword using a polar code, the device comprising programmable hardware, wherein the device is configured to:
   receive the input sequence to be transmitted;
   sequentially encode each of a plurality of blocks of the input sequence by applying a sliding window to the input sequence, wherein each block of the input sequence is encoded based on an exclusive (XOR) operation of the block and a previous block of the input sequence to obtain a codeword block of the codeword;
   sequentially output each obtained codeword block of the codeword; and
   transmit the obtained codeword blocks of the codeword over a communication channel,
   wherein the previous block is equal to the last block of the input sequence.

2. The device of claim 1, wherein the device is further configured to apply a transformation matrix, $T_{M/2}$, of a polar code of length M/2, wherein $T_{M/2}=T_2^{\otimes n}$, with $n=\log_2(M)$ and M being a size of the sliding window, to the block and the previous block of the input sequence to obtain the codeword block of the codeword.

3. The device of claim 2, wherein the device is further configured to calculate a first block on the basis of the predetermined block and the transformation matrix $T_{M/2}$.

4. The device of claim 1, wherein the device is further configured to:
   determine a reliability of bit positions of each block of the input sequence;
   determine an information set $I_i$ of size $K_i$ for each block of the input sequence, wherein $K_i$ corresponds to a size of a corresponding block of the message bits mi and wherein the set $I_i$ corresponds to the $K_i$ bit positions of each block of the input sequence having a highest reliability; and
   generate each block of the input sequence by placing the message bits $m_i$ in the positions defined by $I_i$.

5. A device for decoding a sequence of bits into an output sequence using a polar code, wherein the sequence of bits represents a codeword after a transmission over a communication channel, the device comprising programmable hardware, wherein the device is configured to:
- receive the sequence of bits from a communication channel;
- sequentially decode each of a plurality of blocks of the sequence of bits by applying a sliding window to obtain an auxiliary sequence; and
- process the auxiliary sequence to obtain the output sequence,
- wherein each block of the output sequence is processed based on an exclusive (XOR) operation of a block of the auxiliary sequence and a previous block of the auxiliary sequence,
- wherein the previous block is equal to the last block of the sequence of bits.

6. The device of claim 5, wherein the device is further configured to obtain message bits from the output sequence.

7. A method for encoding an input sequence comprising message bits into a codeword using a polar code, the method comprising:
- receiving the input sequence to be transmitted;
- sequentially encoding each of a plurality of blocks of the input sequence by applying a sliding window to the input sequence;
- encoding each block of the input sequence based on an exclusive (XOR) operation of the block and a previous block of the input sequence to obtain a codeword block of the codeword;
- sequentially outputting each obtained codeword block of the codeword; and
- transmitting the obtained codeword blocks of the codeword over a communication channel,
- wherein the previous block is equal to the last block of the input sequence.

8. A method for decoding a sequence of bits into an output sequence using a polar code, wherein the sequence of bits represents a codeword after a transmission over a communication channel, the method comprising:
- receiving the sequence of bits from a communication channel;
- sequentially decoding each of a plurality of blocks of the sequence of bits by applying a sliding window to obtain an auxiliary sequence; and
- processing the auxiliary sequence to obtain the output sequence, wherein each block of the output sequence is processed based on an exclusive (XOR) operation of a block of the auxiliary sequence and a previous block of the auxiliary sequence,
- wherein the previous block is equal to the last block of the sequence of bits.

9. A non-transitory computer readable storage medium comprising a computer program comprising a program code for performing the method according to claim 7, when executed on a computer.

10. A non-transitory computer readable storage medium comprising a computer program comprising a program code for performing the method according to claim 8, when executed on a computer.

* * * * *